United States Patent [19]

Ball

[11] 4,038,616
[45] July 26, 1977

[54] VACUUM TUBE GAS TEST APPARATUS

[75] Inventor: Ervin Matthew Ball, Zionsville, Ind.

[73] Assignee: RCA Corporation, New York, N.Y.

[21] Appl. No.: 681,694

[22] Filed: Apr. 29, 1976

[51] Int. Cl.² .......................................... G01R 31/024
[52] U.S. Cl. ................................. 324/20 CR; 316/27
[58] Field of Search ................... 324/20 CR, 78 E, 23; 316/27

[56] References Cited
U.S. PATENT DOCUMENTS 3,004,213  10/1961  Reid .................................. 324/20 CR Primary Examiner—M. Tokar
Attorney, Agent, or Firm—Glenn H. Bruestle; William H. Murray

[57] ABSTRACT

A cathode ray tube, having a cathode and first, second and third grid electrodes, is biased on to allow an electron current to flow from the cathode to the second grid electrode during a first time period. A first voltage, which is proportional to a sum of gas plus leakage currents flowing in the third grid electrode circuit during the first time period, is applied to a first terminal of a capacitor having first and second terminals. The capacitor is charged to the first voltage by momentarily grounding the second terminal. During a second time period following the first time period, the cathode ray tube is biased off causing cessation of the electron current flow from the cathode to the second grid electrode and of the gas current to the third grid electrode. A second voltage which is proportional to the leakage current flowing in the third grid electrode circuit during the second time period, is applied to the first terminal of the capacitor. A high impedance voltage meter measures a third voltage appearing at the second terminal at the capacitor which is proportional to the gas current.

16 Claims, 4 Drawing Figures

U.S. Patent  July 26, 1977  4,038,616

VACUUM TUBE GAS TEST APPARATUS

BACKGROUND OF THE INVENTION

This invention relates to apparatus for measuring gas current in a vacuum tube and more particularly to apparatus for measuring gas current in a cathode ray tube.

In most vacuum tubes, the presence of gas is undesirable since the resulting ionization within the tube permits an excessive flow of grid current and has a deleterious effect on the cathode as well as other potentially damaging effects. In addition, the electrical characteristics of a gassy tube (having gas therein) are not constant and the operation of such is thus irregular. This is objectionable in cathode ray tubes where smooth response is essential for undistorted reproduction of images being shown on the screen.

The degree of vacuum can be accurately estimated by measuring the gas current (also referred to as the ionization current) in the tube. Since the gas current in ordinary vacuum tubes is relatively great, there is no need for a particularly sensitive meter in conventional tube testers to determine such current. Consequently, stray current due to high resistance leakage paths will have little effect on such a meter. However, in the case of cathode ray tubes where a very sensitive indicating device is required to measure the minute gas current, such stray currents will also be indicated and, unless they can be compensated for without affecting the sensitivity of the indicating device, the gas current reading will be unreliable. In most of today's highly evacuated cathode ray tubes, the leakage current will practically totally obscure the gas current.

One prior method of measuring minute gas currents in cathode ray tubes is described in U.S. Pat. No. 2,632,134 issued to Reid. In this method, the relatively large leakage current is compensated for by "zeroing" the indicating meter before the gas current is measured. This requires an operator to, in effect, measure and compensate for the leakage current of each individual cathode ray tube in order to obtain an accurate gas current measurement. For large quantities of cathode ray tubes, this procedure can be very time consuming.

SUMMARY OF THE INVENTION

An apparatus for measuring gas current ($I_g$) in the presence of leakage current ($I_l$) in a vacuum tube comprising means for energizing the tube to produce a current ($I_k$) from a cathode to a first electrode and $I_g$ and $I_l$ to a second electrode of the tube. Also included are means for energizing the tube to prevent $I_k$ and $I_g$ but to produce $I_l$ and means for generating a first voltage proportional to the sum of $I_g$ and $I_l$ and a second voltage proportional to $I_l$. The apparatus also comprises means for applying the first and second voltages sequentially to a voltage differentiation means to produce a third voltage which is equal to the difference between the first and second voltages and which is representative of $I_g$.

DETAILED DESCRIPTION

Figure 1A:
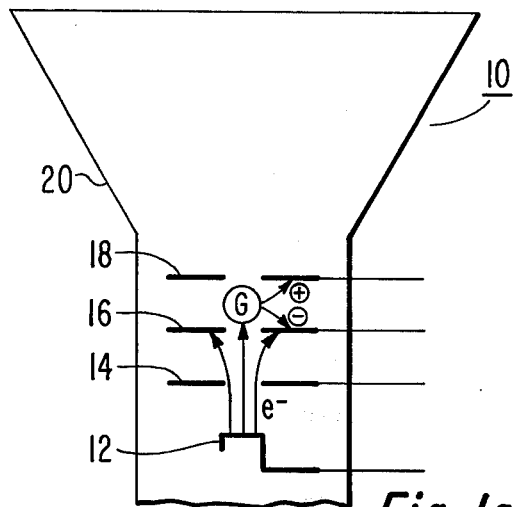
FIG 1a is a schematic diagram of a cathode ray tube having a cathode and G1, G2 and G3 grids and depicting an electron current flow from the cathode to the G2 grid.

In FIGURE 1a there is schematically shown a cathode ray tube generally referred to as 10. The cathode ray tube 10 includes, in spaced-apart relation in the order named, a cathode 12, a G1 grid 14, a G2 grid 16 and a G3 grid 18. The G1, G2 and G3 grids may also be referred to respectively as the first, second and third grids. The cathode, G1 grid, G2 grid and G3 grid are enclosed within an evacuated envelope 20.

It is known that in spite of the use of the best available evacuation techniques, residual gas molecules, identified as G in FIG. 1a, remain within the evacuated envelope 20. When the tube is operated, some electrons from the cathode strike and ionize these gas molecules giving rise to a gas current. For example, in an RCA type 25VEDP22 color picture tube, with the cathode 12 at ground potential, the G2 grid 16 at +200 volts and the G3 grid 18 at approximately −26 volts, a voltage (approximately −15 volts) may be applied to the G1 grid 14 and adjusted to permit 1 milliampere of cathode current. With these voltages applied, most of the electrons $e-$ travel from the cathode 12, through the G1 grid 14 and strike the G2 grid 16. Some of the electrons, however, pass through the G2 grid 16, striking and ionizing some of those gas molecules G which are present in the space between the G2 and G3 grids. Due to the difference in potential between the G2 and G3 grids, the positive gas ions + travel to the G3 grid 18 creating what is commonly known as a "gas current" in the G3 grid circuit. It should also be noted that due to unavoidable high resistance leakage paths, there will also be a leakage current in the G3 grid circuit between the G3 and adjacent electrodes.

Figure 1B:
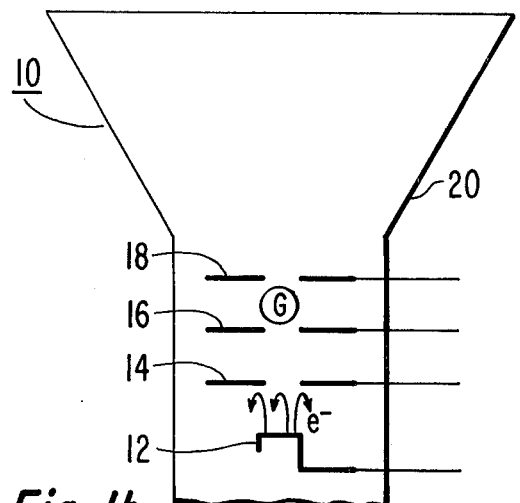
FIG. 1b is a schematic diagram of the cathode ray tube in which the electron current flow is terminated.

FIG. 1b depicts the paths of cathode electrons $e-$ when the tube 10 is biased "off." This condition occurs for example, in the 25VEDP22 color picture tube, when the cathode 12 is at ground potential, the G2 grid 16 is at +200 volts, the G3 grid 18 at −26 volts and the G1 grid 14 at approximately −150 volts. With these operating potentials applied, the cathode electrons $e-$ are unable to pass through the G1 grid 14. Consequently, the cathode electrons $e-$ will not strike and ionize the gas molecules G in the space between the G2 and G3 grids. As a result, there will be no gas current in the G3 grid circuit. However, there will still be a leakage current in the G3 grid circuit.

Figure 2:
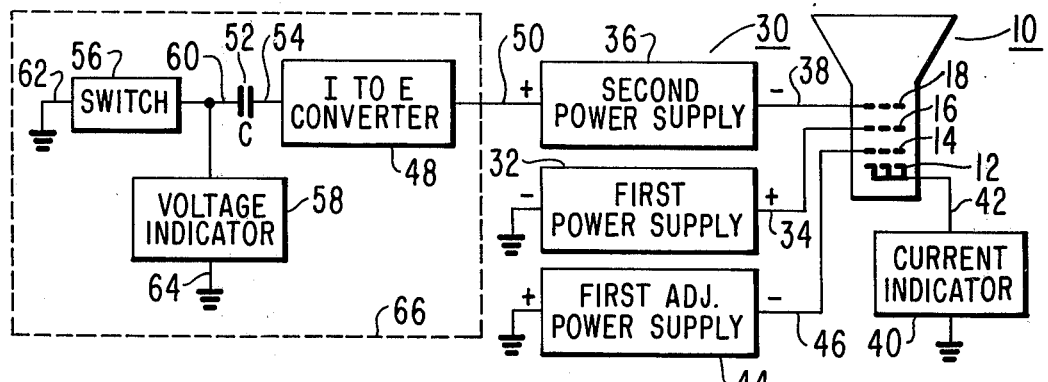
FIG. 2 is a block diagram of the vacuum tube gas test apparatus of the present invention.

In FIG. 2 there is shown a block diagram of the vacuum tube gas test apparatus of the present invention generally referred to as 30. The apparatus 30 comprises a first dc power supply 32 having a positive output terminal which is electrically connected to the G2 grid 16 of the cathode ray tube 10 under test by means of an electrical conductor 34, and a negative output terminal which is connected to ground. Also included is a second dc power supply 36 having positive and negative output terminals. The negative output terminal is electrically connected to the G3 grid 18 of the tube 10 under test by means of a conductor 38. The cathode 12 of the tube 10 is electrically connected to ground through a current indicator 40 by means of a conductor 42. The current indicator can be, for example, a commercially available milliammeter. The apparatus 30 also includes a first adjustable dc power supply 44 having a positive output terminal which is electrically connected to ground and a negative output terminal which is electrically connected to the G1 grid 14 by means of a conductor 46.

The positive output terminal of the second dc power supply 36 is connected to an input terminal of a current-to-voltage (I to E) converter 48 by means of a conductor 50. An output of the I to E converter 48 is connected to a first terminal of a capacitive storage element 52, having first and second terminals, by means of a conductor 54. The second terminal of the capacitive storage element 52 is connected to one terminal of a single pole single throw switch 56 and one measurement terminal of a voltage indicator 58, having two measurement terminals, by means of a branching conductor 60. The other terminal of the switch 56 is connected to ground by means of a conductor 62. The other measurement terminal of the voltage indicator 58 is connected to ground by means of a conductor 64.

Figure 3:
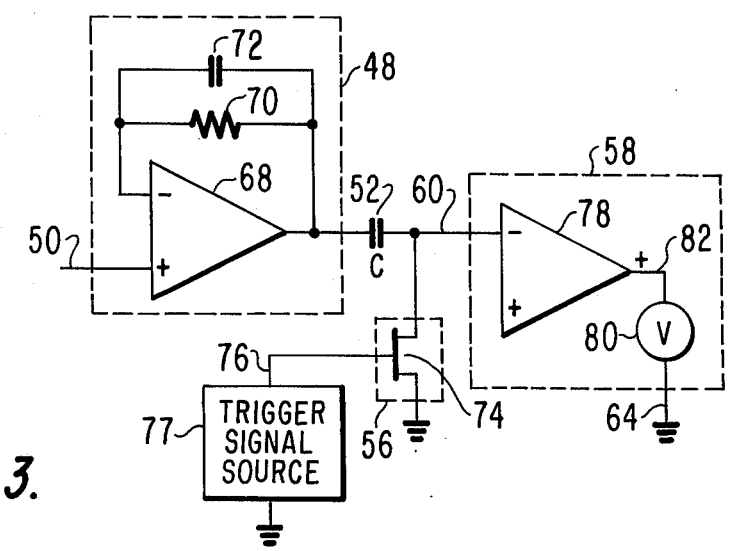
FIG. 3 is a schematic diagram of a gas test circuit of the apparatus of the present invention.

FIG. 3 is a schematic diagram of the elements contained within the dotted line 66 of FIG. 2. The I to E converter 48 comprises an operational amplifier 68 such as a National Semiconductor Corporation Type LH0022 "High Performance FET Operational Amplifier." A resistor 70 and a capacitor 72 are connected in parallel and form a feedback path from the output to an inverting input of the amplifier 68. The value of the capacitor 72, for example, is 0.05 microfarads and the resistor 70, 2 megohms, which yields a gain of $2 \times 10^6$. The switch 56 can be a high impedance semiconductor switch such as a type 2N4392 Field Effect Transistor 74 having a gate terminal 76 to which a suitable trigger signal, from a trigger signal source 77, can be applied. Alternatively, the switch 56 can be an ordinary manually operated push button switch.

The voltage indicator 58 comprises an operational amplifier 78 having a high input impedance on the order of $10^{12}$ ohms such as a type LH0022 described above. The output of the amplifier 78 is connected to one measurement terminal of a volt meter 80, having two measurement terminals, by means of a conductor 82. The other measurement terminal is connected to ground by means of the conductor 64. The capacitive storage element 52 comprises, for example, a 0.1 microfarad capacitor.

The apparatus 30 of the present invention is used to measure gas current as follows. A first operating potential, for example +200 volts, is applied to the G2 grid 16 of the cathode ray tube 10 from the first dc power supply 32. A second operating potential, for example, −26 volts, is applied to the G3 grid 18 from the second dc power supply 36. A bias potential is applied to the G1 grid 14 by the first adjustable dc power supply 44. The bias potential is adjusted until a desired cathode current, for example, 1 milliamp, is flowing as indicated by the current indicator 40.

A first time period commences when the desired cathode current is flowing. During this first time period, the input to the I to E Converter 48 comprises gas current ($I_g$) plus leakage current ($I_l$) flowing in the G3 grid circuit. A typical value of gas plus leakage currents, used here for illustration purposes only, is 0.505 microamps. Since the gain of the I to E converter is $2 \times 10^6$ as previously stated, the output of the I to E converter is 1.01 volts for this illustration. This output voltage is applied to the first terminal of the capacitive storage element 52 as previously described. The switch 56 is momentarily closed during the first time period in order to charge the capacitive storage element to the output voltage which is 1.01 volts in this example. Switch 56 is re-opened prior to the end of the first time period in order to enable the capacitive storage element to retain its charge. Tests have shown that measurement accuracy is enhanced if the switch is closed for a minimum of 10 milliseconds.

The first time period ends and a second time period begins when the cathode current flow is terminated. This is accomplished by adjusting the bias potential applied to the G1 grid 14 until the cathode current is substantially 0 as indicated by the current indicator 40. Since no cathode current is flowing, the input to the I to E converter 48 comprises leakage current ($I_l$) only. A typical value of leakage current, for the example given herein, is 0.5 microamps. This results in an I to E converter output of 1.00 volt which is applied to the first terminal of the capacitive storage element 52.

Since the capacitive storage element 52 was previously charged to 1.01 volts and realizing this charge does not appreciatively leak off through the high impedance paths presented by the open switch 56 and the operational amplifier 78 of the voltage indicator 58, the 1.00 volt present at the first terminal of the capacitive storage element 52 will drive the voltage appearing at the second terminal to −0.01 volt. This occurs because the charge across the capacitor remains at 1.01 volts. Consequently, the voltage appearing at the second terminal of the capacitive storage element 52 is proportional to the gas current ($I_g$) plus leakage current ($I_l$) minus the leakage current ($I_l$), the difference of which is proportional to the gas current alone. The voltage appearing at the second terminal is displayed by the volt meter 80 which can be calibrated in units of gas current.

The apparatus of the present invention is capable of measuring gas current accurately in the presence of large leakage currents which may be on the order of 1000 times larger than the gas current. The leakage current plus gas current may be a positive or negative value and, as previously described in detail, is stored on a capacitor by momentarily grounding one side of the capacitor through, for example, a field effect transistor. The capacitor, which is now charged, transmits only the gas current to the voltage indicator 58. Since the same amplifiers are used in both the leakage and gas measurements, any offset voltages or leakage currents in the measuring circuits are automatically eliminated.

I claim:

1. An apparatus for measuring gas current ($I_g$) in the presence of leakage current ($I_l$) in a vacuum tube, said apparatus comprising:

a. means for energizing said tube to produce a current ($I_k$) from a cathode to a first electrode and said $I_g$ and said $I_l$ to a second electrode of said tube;

b. means for energizing said tube to prevent said $I_k$ and $I_g$ but to produce said $I_l$;

c. means for generating a first voltage proportional to the sum of said $I_g$ and said $I_l$ and a second voltage proportional to said $I_l$; and d. means for applying said first and second voltages sequentially to a voltage differentiation means to produce a third voltage which is equal to the difference between said first and second voltages and which is representative of said $I_g$.

2. An apparatus in accordance with claim 1 wherein said means for energizing said tube to produce a current ($I_k$) from a cathode to a first electrode and said $I_g$ and said $I_l$ to a second electrode of said tube comprises:

a. means for applying a first operating potential to said first electrode, the first operating potential being positive with respect to a cathode potential;

b. means for applying a second operating potential to said second electrode, the second operating potential being negative with respect to said cathode potential; and c. means for applying a first bias potential to a grid electrode disposed between said cathode and said first electrode, the magnitude of the first bias potential being such as to permit a predetermined flow of said $I_k$.

3. An apparatus in accordance with claim 2 wherein said means for energizing said tube to prevent said $I_k$ and said $I_g$ but to produce said $I_l$ comprises:

a. means for applying said first operating potential to said first electrode;

b. means for applying said second operating potential to said second electrode; and c. means for applying a second bias potential to said grid electrode, the second bias potential having a magnitude which is sufficiently negative with respect to said cathode potential to prevent the flow of $I_k$ to said first electrode.

4. An apparatus in accordance with claim 3 wherein said means for generating a first voltage proportional to the sum of said $I_g$ and said $I_l$ and a second voltage proportional to said $I_l$ comprises current-to-voltage conversion means having a current input which is electrically connected to said second electrode of said tube and having a voltage output.

5. An apparatus in accordance with claim 4 wherein said current-to-voltage conversion means comprises an operational amplifier having a resistive feedback path of resistance value R whereby the output voltage is equal to R times the input current.

6. An apparatus in accordance with claim 4 wherein said voltage differentiation means comprises a two terminal, capacitive storage element, one terminal of which is electrically connected to the voltage output of said current-to-voltage conversion means, and switching means for charging said capacitive storage element by short circuiting the other terminal of said capacitive storage element to said cathode for a predetermined period of time T.

7. An apparatus in accordance with claim 6 wherein said T occurs during the application of said first bias potential.

8. An apparatus in accordance with claim 6 wherein said T occurs during the application of said second bias potential.

9. An apparatus in accordance with claim 6 wherein said switching means comprises a field effect transistor having source, gate and drain terminals, the source terminal of which is electrically connected to said other terminal of said capacitive storage element, the drain terminal of which is electrically connected to said cathode, and the gate terminal of which is electrically connected to means for generating a pulse having a duration substantially equal to said period of time T and a magnitude sufficient to bias said field effect transistor on, thereby creating a low resistance path between the source and drain terminals during said T.

10. An apparatus in accordance with claim 9 wherein the duration of said T is at least 10 milliseconds.

11. An apparatus for measuring gas current ($I_g$) in a color television picture tube having three cathodes, a G1 grid electrode spaced from said cathodes, a G2 grid electrode spaced from said G1 grid electrode and a G3 grid electrode spaced from said G2 grid electrode, said apparatus comprising:

a. means for applying a common reference potential to said cathode;

b. means for applying a first operating potential to said G2 grid electrode, the first operating potential being negative with respect to said reference potential;

c. means for applying a second operating potential to said G3 grid electrode, said second operating potential being negative with respect to said reference potential;

d. means for applying a first bias potential to said G1 grid electrode in order to produce electron current flow from said cathode to said G2 grid electrode during a first time period;

e. means for applying a second bias potential to said G1 grid electrode in order to terminate said electron current flow during a second time period;

f. current to voltage conversion means for sensing the flow of current to said G3 grid electrode and responding to provide, at an output terminal, a voltage proportional to said G3 grid electrode current;

g. a capacitor having first and second terminals, the first terminal being electrically connected to the output terminal of the current-to-voltage conversion means;

h. a field effect transistor having source, drain and gate electrodes, the source electrode being electrically connected to the second terminal of said capacitor, the drain electrode being electrically connected to the reference potential and the gate electrode being electrically connected to means for generating a pulse of at least 10 milliseconds in duration in order to switch the field effect transistor on during said first time period, the switched-on field effect transistor providing a substantially short circuit path between the second terminal of said capacitor and said reference potential; and i. means for measuring a voltage at the second terminal of said capacitor during said second time period, said voltage being proportional to said gas current.

12. A method of measuring gas current ($I_g$) in the presence of leakage current ($I_l$) in a vacuum tube comprising the steps of:

a. energizing said tube to produce a cathode current ($I_k$) to a first grid and said $I_g$ and said $I_l$ to a second grid of said tube;

b. generating a first voltage proportional to the sum of said $I_g$ and $I_l$, and a second voltage proportional to said $I_l$;

c. energizing said tube to prevent said $I_k$ and said $I_g$ but to produce said $I_l$; and d. applying said first and second voltage sequentially to a voltage differentiating means to produce a third voltage which is equal to the difference between said first and said second voltages and which is representative of said $I_g$.

13. A method in accordance with claim 12 wherein step (a) comprises:

i. applying a first operating potential to said first electrode, the first operating potential being positive with respect to a cathode potential;

ii. applying a second operating potential to said second electrode, the second operating potential being negative with respect to said cathode potential; and iii. applying a first bias potential to a grid electrode disposed between said cathode and said first electrode, the magnitude of the first bias potential being such as to permit a predetermined flow of said $I_k$.

14. A method in accordance with claim 13 wherein step (c) comprises:
   i. applying said first operating potential to said first electrode;
   ii. applying said second operating potential to said second electrode; and
   iii. applying a second bias potential to said grid electrode, the second bias potential having a magnitude which is sufficiently negative with respect to said cathode potential to prevent the flow of said $I_k$ to said first electrode.

15. A method in accordance with claim 14 wherein step (b) comprises providing an operational amplifier having an input which is electrically connected to said second electrode of said tube and having a resistive feedback path comprising a resistance R electrically connected between an output and the input of said operational amplifier whereby a voltage appearing at the output is equal to R times an input current.

16. A method in accordance with claim 15 wherein step (d) comprises:
   i. providing a two terminal capacitive storage element;
   ii. applying said first voltage to a first terminal of the capacitive storage element;
   iii. charging the capacitive storage element to said first voltage by momentarily applying said reference potential to the second terminal of the capacitive storage element during application of said first voltage to the first terminal;
   iv. applying said second voltage to the first terminal of the capacitive storage element; and
   v. measuring said third voltage at the second terminal of the capacitive storage element during application of said second voltage to the first terminal.

* * * * *

UNITED STATES PATENT AND TRADEMARK OFFICE
CERTIFICATE OF CORRECTION

PATENT NO. : 4,038,616
DATED : July 26, 1977
INVENTOR(S) : Ervin Matthew Ball

It is certified that error appears in the above-identified patent and that said Letters Patent is hereby corrected as shown below:

In column 6, line 8, "negative" should read ---positive---.

*Signed and Sealed this*

*Twenty-seventh* Day of *November 1979*

[SEAL]

*Attest:*

RUTH C. MASON
*Attesting Officer*

LUTRELLE F. PARKER
*Acting Commissioner of Patents and Trademarks*